(12) United States Patent
Yan et al.

(10) Patent No.: US 7,754,994 B2
(45) Date of Patent: Jul. 13, 2010

(54) CLEANING DEVICE USING ATMOSPHERIC GAS DISCHARGE PLASMA

(75) Inventors: Jyh-Ming Yan, Taoyuan County (TW);
Shiaw-Huei Chen, Taipei County (TW);
Ming-Song Yang, Taipei (TW);
Men-Han Huang, Taoyuan County (TW); Yung-Chih Chen, Taipei (TW)

(73) Assignee: Atomic Energy Council, Taoyuan (TW)

( * ) Notice: Subject to any disclaimer, the term of this patent is extended or adjusted under 35 U.S.C. 154(b) by 153 days.

(21) Appl. No.: 11/637,869

(22) Filed: Dec. 13, 2006

(65) Prior Publication Data

US 2008/0142057 A1     Jun. 19, 2008

(51) Int. Cl.
*B23K 15/00* (2006.01)
*C23C 16/00* (2006.01)
(52) U.S. Cl. .............................. 219/121.11; 118/723 R
(58) Field of Classification Search ............. 219/121.11
See application file for complete search history.

(56) References Cited

U.S. PATENT DOCUMENTS

| | | | | |
|---|---|---|---|---|
| 3,641,308 A | * | 2/1972 | Couch et al. ............. 219/121.5 |
| 5,194,715 A | * | 3/1993 | Severance et al. ...... 219/121.48 |
| 5,626,677 A | * | 5/1997 | Shirahata ..................... 118/719 |
| 6,156,995 A | * | 12/2000 | Severance, Jr. ........... 219/121.5 |
| 6,652,069 B2 | * | 11/2003 | Toda et al. .................... 347/45 |
| 2003/0034333 A1 | * | 2/2003 | Horner-Richardson et al. ... 219/121.51 |

FOREIGN PATENT DOCUMENTS

JP      62-118978      *  5/1987

OTHER PUBLICATIONS

English abstract of JP 62-118978, Fukae, May 1987.*

* cited by examiner

*Primary Examiner*—Ram N Kackar
*Assistant Examiner*—Keath T Chen
(74) *Attorney, Agent, or Firm*—Jackson IPG PLLC

(57) ABSTRACT

Atmospheric gas discharge plasma is generated in a gas whirlpool cavity. Then the plasma is sprayed out in a gas flow to clean an object. The whole process is simple with merits of utility and cost savings. And objects can be cleaned one after one continuously.

9 Claims, 2 Drawing Sheets

CLEANING DEVICE USING ATMOSPHERIC GAS DISCHARGE PLASMA

FIELD OF THE INVENTION

Figure 1:
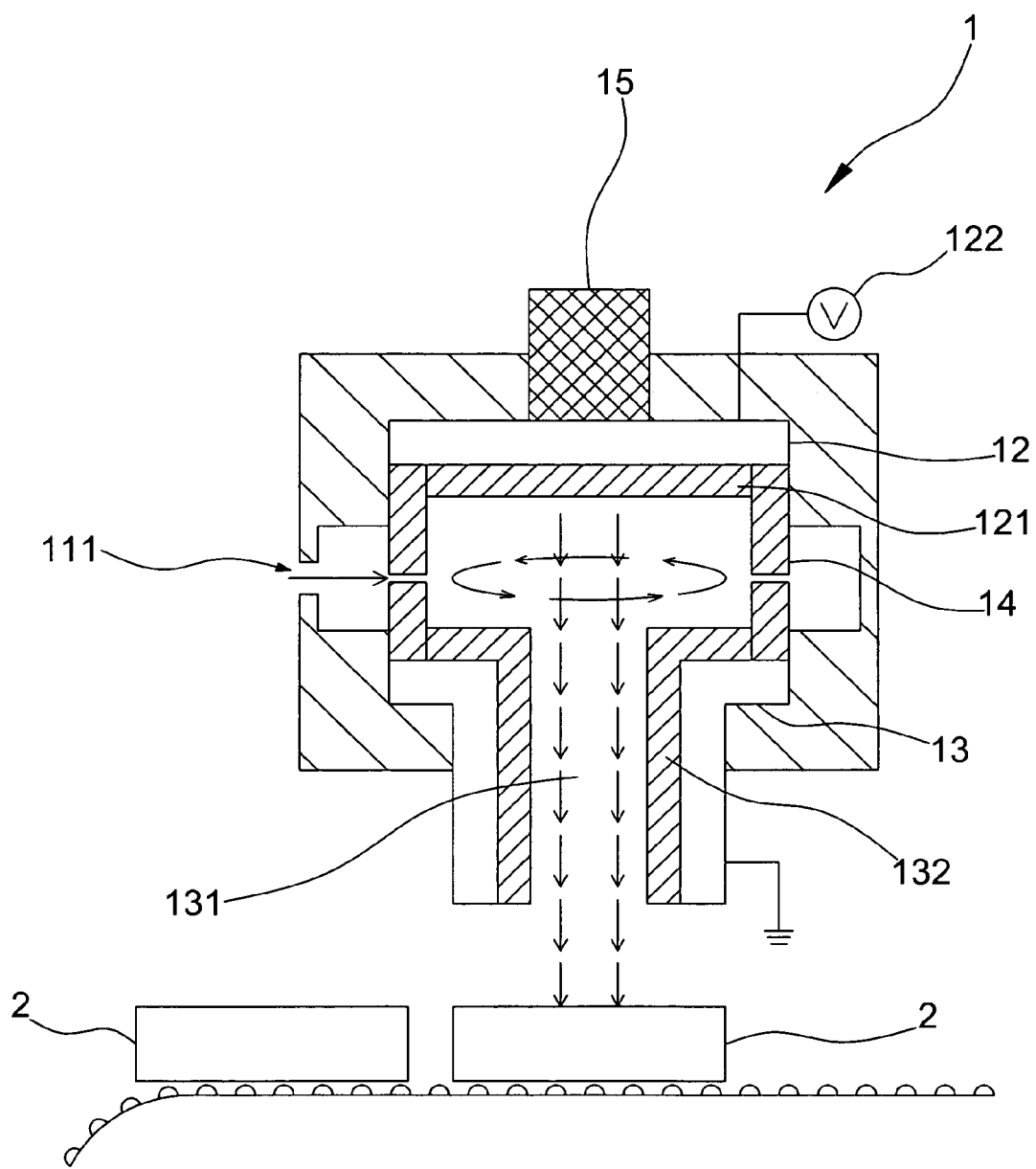

The present invention relates to a cleaning device; more particularly relates to utilizing a specific gas in a whirlpool cavity to obtain a highly reactive non-thermal plasma by discharging at atmospheric pressure for the purpose of cleaning a surface of an object, where the whole process is straight forward and simple, objects can be cleaned with this plasma cleaning device one after one continuously.

DESCRIPTION OF THE RELATED ARTS

A traditional procedure for cleaning objects consumes a lot of chemical cleaning solutions, like detergents, isopropanol etc., together followed with a large volume of water for rinsing, and hot air drying afterwards. Such a process greatly pollutes the environment; not to mention utility wasted and time consuming.

Gas plasma cleaning technique is a dry clean process, it uses highly active free electrons produced by high-voltage breakdown in a discharging gas to collide with gas particles for obtaining free radicals and excited molecules to react with, such as to oxidize, organic contaminations on surface of the object. The contaminations thus become harmless or low polluted and remove from the surface, so the object is cleaned. In the whole process, the energy used is mainly added on the electrons while the gas molecule itself has little increase in energy; so, the temperature of the electrons is much higher than that of the gas molecule, which is thus called non-thermal plasma (NTP). By using this method, a great a mount of energy is saved with high efficiency; and chemicals used are none or greatly reduced.

The design of a high-voltage plasma reactor is closely related to the requirements of its target. There are generally two main types of atmospheric pressure discharges used to generate plasma for object cleaning purpose, a radio frequency (RF) discharging and a dielectric barrier discharging, respectively. The RF discharging uses a metal oscillation chamber for discharging. Because to initiate discharging in the atmospheric pressure is difficult, higher RF power or other technique is usually adopted for easing this trouble. Usually a tuning device with power monitoring is also required to eliminate RF reflections by using a matching circuit. Thus, a complex and expansive equipment is constructed. The dielectric barrier discharging is originated from Siemens in 1857 for producing ozone and is used till now without great changes. This method uses one or two insulating materials to keep the discharging electrodes from arcing. Besides, a general high-voltage alternating current power source can be used so that cost is saved and this method is thus widely used.

A prior art of a device using plasma for cleaning is called "A cleaning-plasma device", where a few flat to-be-cleaned objects are laid on a supporting rack coordinated with a trench in a chamber. With a power supplier and a magnet iron at a side of an electrode, a plasma is provided to clean an object. This method is characterized in a driven bar in the supporting rack connected with a power source to be driven for moving up and down to push out the to-be-cleaned objects one after one. Hence, a cleaning-plasma device is obtained with a good cleaning effects.

The prior art of the cleaning-plasma device cleans objects of substrates; yet, the structure is complex. Several substrates have to be put on the trench at a time. The time period of required cleaning is long. The number of substrates cleaned is limited. And it also consumes extra time to change the substrates. In addition, on replacing the cleaning-plasma device, power is wasted if the power source is not closed; and time is wasted if the power source is closed and re-opened. Hence, the prior arts do not fulfill users' requests on actual use.

SUMMARY OF THE INVENTION

The main purpose of the present invention is to provide a cleaning device for cleaning an object with saved power and cost by a plasma through simply putting the object at the spray mouth of the plasma; and to clean the objects one after one continuously.

To achieve the above purpose, the present invention is a cleaning device using an atmospheric gas discharge plasma, comprising an gas whirlpool cavity having at least two gas inputs; a first electrode in the gas whirlpool cavity; a second electrode corresponding to the first electrode in the gas whirlpool cavity; an insulating separator layer between the first electrode and the second electrode; an gas input buffer cavity outside the gas whirlpool cavity; a magnetic field generator located outside the first electrode; and a high-voltage power source electrically coupled with the first electrode and the second electrode to provide required high-voltage needed for obtaining a non-thermal plasma by discharging at atmospheric pressure, where the highly reactive plasma gas is sprayed out from the hollow cylindrical passage to clean an object by simply putting the object at the mouth of the plasma output passage. Accordingly, a novel cleaning device using an atmospheric gas discharge plasma is obtained.

BRIEF DESCRIPTIONS OF THE DRAWINGS

Figure 2:
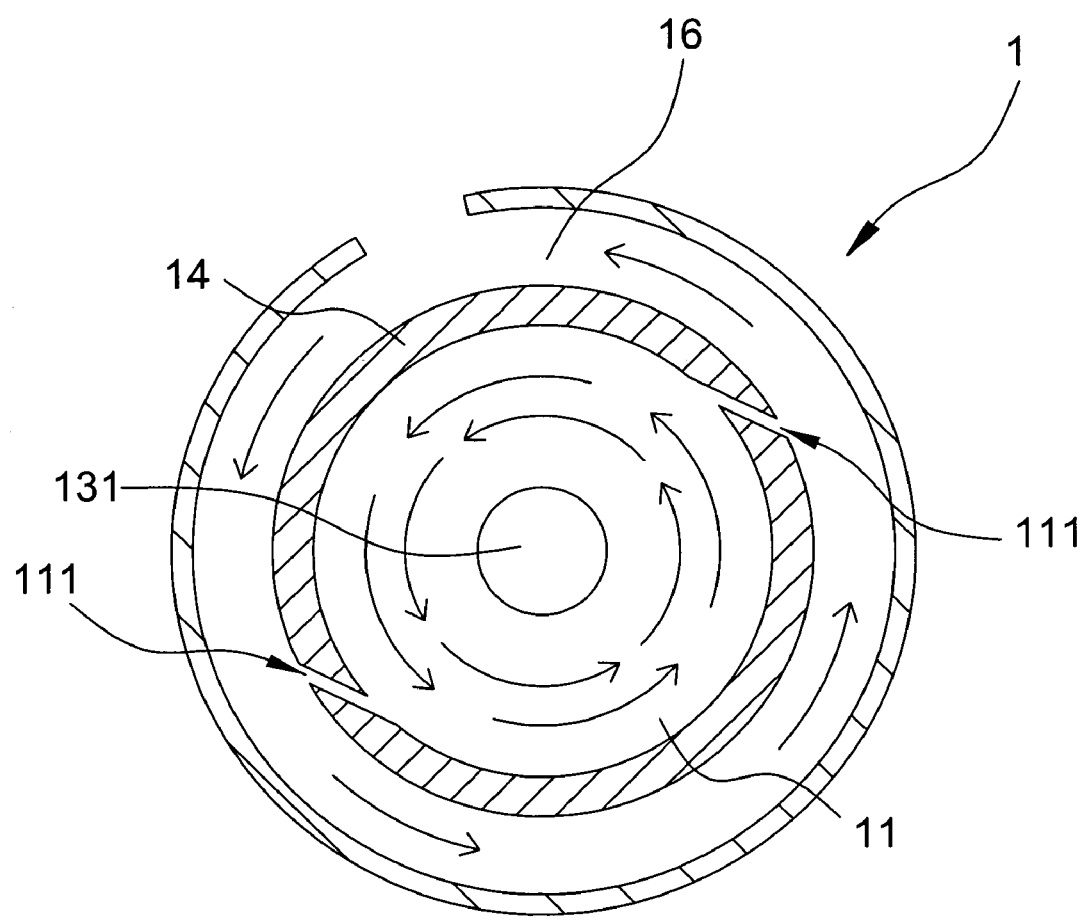

The present invention will be better understood from the following detailed description of the preferred embodiment according to the present invention, taken in conjunction with the accompanying drawings, in which FIG. 1 is the lateral sectional view of the state of use showing the preferred embodiment according to the present invention; and FIG. 2 is the top-down sectional view of the state of use.

DESCRIPTION OF THE PREFERRED EMBODIMENT

The following description of the preferred embodiment is provided to understand the features and the structures of the present invention.

Please refer to FIG. 1 and FIG. 2, which are the lateral sectional view and a top-down sectional view of a state of use showing a preferred embodiment according to the present invention. As shown in the figures, the present invention is a cleaning device using an atmospheric gas discharge plasma 1, comprising an gas whirlpool cavity 11, a first electrode 12, a second electrode 13, an insulating separator layer 14, a magnetic field generator 15 and an gas input buffer cavity 16, where a high-voltage power source 122 is electrically connected with the first electrode 12 and the second electrode 13 to provide required high-voltage power for obtaining a non-thermal plasma (NTP) by a discharging in a gas.

The first electrode 12 is located at an end of the gas whirlpool cavity 11; and, the second electrode 13 is located at another end of the gas whirlpool cavity 11 corresponding to the first electrode 12. The first electrode 12 is covered with a first insulation layer 121 at an end of the first electrode 12; and is deposed with a magnetic field generator 15 at the other end corresponding to the first insulation layer 121. The first electrode has a thickness between 3 millimeters (mm) and 5 mm according to actual operation. And the first electrode 12 is connected with high voltage side of the high-voltage power source 122.

The second electrode 13 has a hollow cylindrical passage 131 at center of the second electrode 13; and a second insulation layer 132 covered at a side of the second electrode 13 near the first electrode 12. And the second electrode 13 is used as a grounding electrode.

The first electrode 12 and the second electrode 13 are made of a conductive metal of a non-magnetic copper alloy. And the insulating separator layer 14 is located between the first electrode 12 and the second electrode 13.

The first insulation layer 121 and the second insulation layer 132 are made of insulating materials such as polytetrafluoroethylene (PTFE), polyetheretherketone (PEEK) polyethylene (PE), ceramics, glass or quartz, etc.; and have thicknesses between 0.5 mm and 3 mm.

And the high-voltage power source 122 is an alternating-current power source having a high-voltage greater than 10 kilo-Volt (kV) and a high-frequency more than 1 kilo-Hertz (kHz).

When using the present invention, a working gas first enters into the gas input buffer cavity 16, and from at least two gas pin-hole inputs 111 to accelerate an gas flow speed in the gas whirlpool cavity 11. The gas whirlpool cavity 11 has the gas pin-hole inputs 111 symmetrically located over a circle, penetrating through the insulating separator layer 14 with a hole of very short diameter about 1 mm. When the working gas enters from the gas pin-hole inputs 111, a high-speed whirlpool of gas is formed in a discharging space of the gas whirlpool cavity 11 to increase the flow path of the working gas in the discharging space for obtaining more free radicals by more collisions. Therein, the gas whirlpool cavity 11 is constructed by the insulating separator layer 14, the first insulation layer 121 and the second insulation layer 132. The working gas can be a dry gas of oxygen gas, nitrogen gas, air, helium gas, argon gas, carbon tetrafluoride, and a mixture of two or more of the above mentioned gases; and can be added with a water vapor according to the nature of contamination on the to-be-cleaned object 2. The insulating separator layer 14 is made of PTFE or PE having a thickness between 0.5 mm and 3 mm according to an actual operation and a discharging gap, where the discharging gap is formed between the first insulation layer 121 and the second insulation layer 132 and has a gap length between 0.3 centimeters (cm) and 1 cm.

When the working gas enters the gas input buffer cavity 16 through the gas pin-hole inputs 111, the working gas is accelerated to form a high-speed whirlpool of gas in the gas whirlpool cavity 11. At the moment, the high-voltage power source 122 connected to the first electrode 12 and the second electrode 13 initiates a high voltage breakdown in atmospheric pressure, so that the working gas in the gas whirlpool cavity 11 produces a plasma owing to an ionization by electric discharging. The magnetic field generator 15 is located above the center of the gas whirlpool cavity 11 so that a symmetric axial magnetic field lines is formed to guide and control flow direction of the ionized gas and to accelerate the gas speed of the spray. Hence, the plasma is sprayed out from the hollow cylindrical passage 131. The hollow cylindrical passage 131. The hollow cylindrical material made of PTFE, PEEK or PE with a diameter between 0.5 cm and 1.5 cm; and has an output of a gradually narrowed nozzle with a mouth having a diameter between 0.3 cm and 0.8 cm to increase gas flow speed at the output. The to-be-cleaned object 2 is put at the hollow cylindrical passage 131 to be cleaned by the plasma. The magnetic field generator can be a high field permanent magnet; or an electric coil magnet having the magnetic field controlled by the current flow within. The gas input buffer cavity 16 provides a buffer space for gas input; is also an insulated fixing part to connect the first electrode 12, the second electrode 13 and the magnetic field generator 15; and is made of an insulated material which can be machinery processing, like PTFE or PEEK etc.

The present invention is operated under an atmospheric pressure and is easily coordinated with processes of a delivery platform to clean the to-be-cleaned objects. And the present invention utilizes an advanced non-thermal plasma cleaning, which is an environmental protection technology, greatly reduce the use of traditional chemical cleaning solutions.

To sum up, the present invention is a cleaning device using an atmospheric gas discharge plasma, where the device is easily operated with merits of utility and cost savings; a to-be-cleaned object is simply put under a plasma nozzle for cleaning; and to-be-cleaned objects are cleaned one after one continuously.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A cleaning device using a non-thermal atmospheric gas discharge plasma, comprising:

a power source having an alternating current voltage of greater than 10 kV and a frequency of greater than 1 kHz;

a gas input buffer cavity;

a generally cylindrical gas whirlpool cavity, said gas whirlpool cavity being located inside said gas input buffer cavity such that the gas input buffer cavity is generally annular in shape, said gas whirlpool cavity comprising at least two symmetrical gas pin-hole inputs connected with the input buffer cavity and arranged tangentially so as to accelerate a circular whirlpool working gas flow within the whirlpool cavity;

a first electrode, said first electrode being located at an end of the gas whirlpool cavity, said first electrode being electrically coupled with said high-voltage power source, said first electrode being covered with a first insulation layer on a surface of said first electrode, such that said first electrode is not exposed to said whirlpool cavity;

a second electrode, said second electrode being located at another end of the gas whirlpool cavity such that the gas whirlpool cavity is interposed between the first and second electrodes, said second electrode being corresponding to said first electrode, said second electrode being a grounding electrode, said second electrode having a hollow cylindrical passage located at center of said second electrode, said second electrode being covered with a second insulation layer on a surface of said second electrode, such that said second electrode is not exposed to said whirlpool cavity;

an insulating separator layer, said insulating separator layer being disposed between said first electrode and said second electrode so as to define a discharging space such that the insulating separator layer, the first insulation layer, and the second insulation together define the gas whirlpool cavity; and a magnetic field generator, said magnetic field generator being disposed on a side of said first electrode, said magnetic field generator corresponding to said first insulation layer, wherein the magnetic field generator is arranged above a center of the whirlpool cavity so as to form symmetric axial magnetic field lines to guide and control a flow direction of an ionized gas and to accelerate a speed of a non-thermal plasma spray out of the hollow passage, wherein the cleaning device initiates a high voltage plasma breakdown of the working gas at atmospheric pressure and cleans a series of workpieces laterally conveyed beneath a mouth of the hollow cylindrical passage with the non-thermal plasma spray, wherein said hollow cylindrical passage has a diameter between 0.5 cm and 1.5 cm; and wherein a mouth of said nozzle has a diameter between 0.3 cm and 0.8 cm.

2. The device according to claim 1, wherein said gas pinhole inputs are symmetrically located on a circle, penetrates through said insulating separator layer, and has a hole diameter of 1 mm±10% (1 millimeter with 10 percents leeway);

wherein said high-speed whirlpool of gas increases a length of a flow path of said working gas in said discharging space.

3. The device according to claim 2, wherein said working gas is selected from a group consisting of oxygen gas, nitrogen gas, air, helium gas, argon gas, carbon tetrafluoride and a mixture of two or more of the above mentioned gases; and wherein said working gas is added with a water vapor according to the nature of contamination on a to-be-cleaned object.

4. The device according to claim 1, wherein said first electrode and said second electrode are made of a conductive metal of a non-magnetic copper alloy; and wherein said first electrode has a thickness between 3 and 5 mm.

5. The device according to claim 1, wherein said insulating separator layer is made of a material selected from a group consisting of polytetrafluoroethylene (PTFE), polyetheretherketone (PEEK) and polyethylene (PE); and wherein said insulating separator layer has a thickness between 0.5 mm and 3 mm which depends on the operating voltage and discharge gap.

6. The device according to claim 1, wherein a discharge gap can be a value between 0.3 centimeters (cm) and 1 cm, which is also depended on the said high-voltage power source and composition of the said working gas.

7. The device according to claim 1, wherein said hollow cylindrical passage is made of an electrical insulated material selected from a group consisting of PTFE, PEEK and PE.

8. The device according to claim 1, wherein said magnetic field generator comprises a permanent magnet; or an electric coil magnet having the magnetic field control led by the current flows within.

9. The device according to claim 1, wherein said gas input buffer cavity is a buffer space for gas input;

wherein said gas input buffer cavity is an insulated fixing member to connect said first electrode, said second electrode and said magnetic field generator; and wherein said gas input buffer cavity is made of an insulated material formed from PTFE or PEEK for machinery processing.

* * * * *